(12) United States Patent
Goodwin

(10) Patent No.: US 10,483,107 B2
(45) Date of Patent: Nov. 19, 2019

(54) ENCODER HEAD WITH BIREFRINGENT ELEMENTS FOR FORMING IMPERFECT RETROREFLECTION AND EXPOSURE SYSTEM UTILIZING THE SAME

(71) Applicant: NIKON CORPORATION, Tokyo (JP)

(72) Inventor: Eric Peter Goodwin, Oro Valley, AZ (US)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/800,480

(22) Filed: Nov. 1, 2017

(65) Prior Publication Data

US 2018/0061627 A1   Mar. 1, 2018

Related U.S. Application Data

(63) Continuation-in-part of application No. 15/483,887, filed on Apr. 10, 2017, now Pat. No. 10,162,087.
(Continued)

(51) Int. Cl.
*H01L 21/027* (2006.01)
*G02B 13/14* (2006.01)
(Continued)

(52) U.S. Cl.
CPC ............ *H01L 21/027* (2013.01); *G01D 5/38* (2013.01); *G02B 5/3083* (2013.01); *G02B 13/14* (2013.01);
(Continued)

(58) Field of Classification Search
CPC ............................ G01D 5/38; G03F 7/70775
See application file for complete search history.

(56) References Cited

U.S. PATENT DOCUMENTS 8,860,949 B2 * 10/2014 Ishizuka ............... G01D 5/266
                                                           356/499
9,074,911 B2   7/2015 Goodwin et al.
(Continued)

OTHER PUBLICATIONS

M. Avendano-Alejo, et al., "Ray Tracing in a Plane-Parallel Uniaxial Plate."

*Primary Examiner* — Shawn Decenzo
(74) *Attorney, Agent, or Firm* — Yakov Sidorin; Quarles & Brady LLP

(57) ABSTRACT

An encoder head configured for use with a lithographic exposure tool. The head is devoid of the multiplicity of optical corner-cubes and includes, instead, a single, geometrically substantially perfect cuboid of optically-isotropic material complemented, in operation, with prismatic elements made of optically anisotropic material to form a contraption that, as a unit, splits a single beam of light delivered to the contraption into four measurement (sub-) beams of light (two in xz-plane, two in yz-plane) and causes each of these sub-beams to interact with the wafer-stage diffraction grating at the same location upon the second pass by the grating as upon the first pass by the grating, thereby solving problems of (i) structural complexity of a conventional encoder head for use in an exposure tool, (ii) burdensome alignment of the multitude of optical prisms in the process of forming such encoder head, and (iii) cyclic non-linear errors associated with measurements involving conventional corner-cubes-based encoder heads while, at the same time, reducing the geometrical footprint of the encoder head.

11 Claims, 10 Drawing Sheets

Related U.S. Application Data

(60) Provisional application No. 62/320,985, filed on Apr. 11, 2016, provisional application No. 62/416,847, filed on Nov. 3, 2016.

(51) Int. Cl.
  *G01D 5/38* (2006.01)
  *G02B 5/30* (2006.01)
  *G02B 27/42* (2006.01)

(52) U.S. Cl.
  CPC .................... *G02B 27/4255* (2013.01); *H01L 2924/00014* (2013.01)

(56) References Cited

U.S. PATENT DOCUMENTS

| | | |
|---|---|---|
| 9,243,896 B2 | 1/2016 | Goodwin |
| 9,746,348 B2 * | 8/2017 | de Groot ................. G01D 5/266 |
| 2010/0297561 A1 * | 11/2010 | Beerens .............. G03F 7/70775 |
| | | 430/322 |
| 2013/0048842 A1 * | 2/2013 | Goodwin ........... G01D 5/34723 |
| | | 250/231.1 |
| 2013/0114062 A1 * | 5/2013 | Liesener ................. G01D 5/38 |
| | | 355/72 |
| 2015/0276385 A1 * | 10/2015 | Goodwin ................ G01B 11/14 |
| | | 356/614 |
| 2016/0102999 A1 * | 4/2016 | Liesener ................ G01D 5/266 |
| | | 356/488 |
| 2017/0030744 A1 * | 2/2017 | Kimura ................... G01D 5/266 |
| 2017/0097574 A1 * | 4/2017 | Goodwin ............ G03F 7/70141 |
| 2017/0292860 A1 | 10/2017 | Goodwin et al. |
| 2018/0066966 A1 * | 3/2018 | Oyama .................... G01D 5/38 |
| 2018/0181006 A1 * | 6/2018 | Goodwin ............ G03F 7/70775 |

\* cited by examiner

FIG. 3C
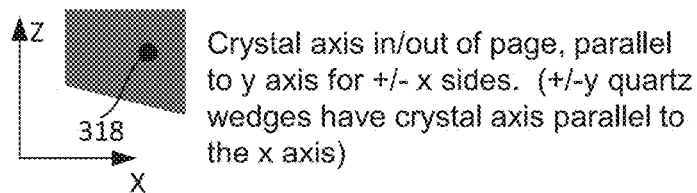
Crystal axis in/out of page, parallel to y axis for +/- x sides. (+/-y quartz wedges have crystal axis parallel to the x axis)
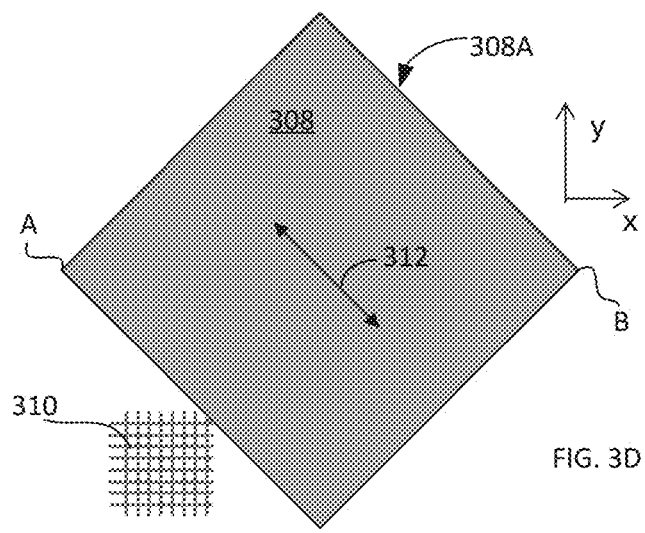
FIG. 3D
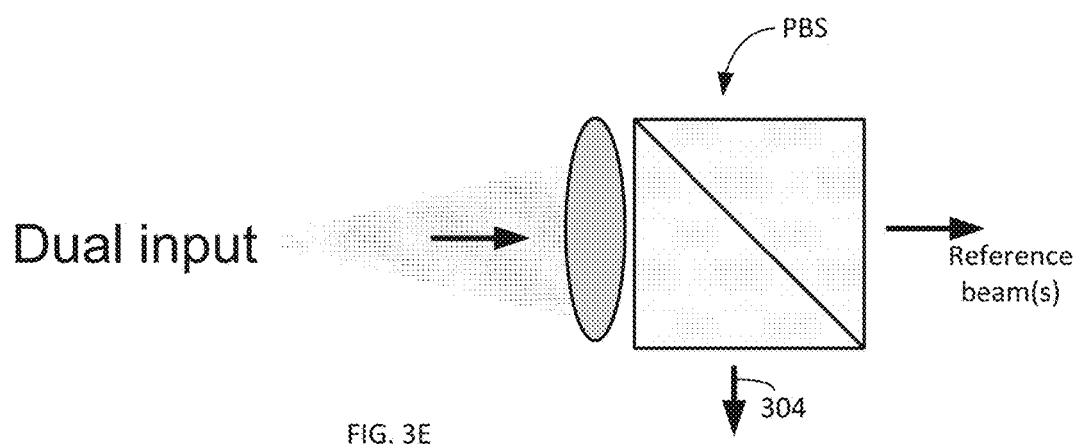
FIG. 3E

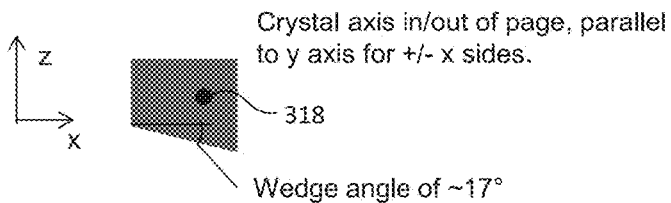

Crystal axis in/out of page, parallel to y axis for +/- x sides.

318

Wedge angle of ~17°

FIG. 4A

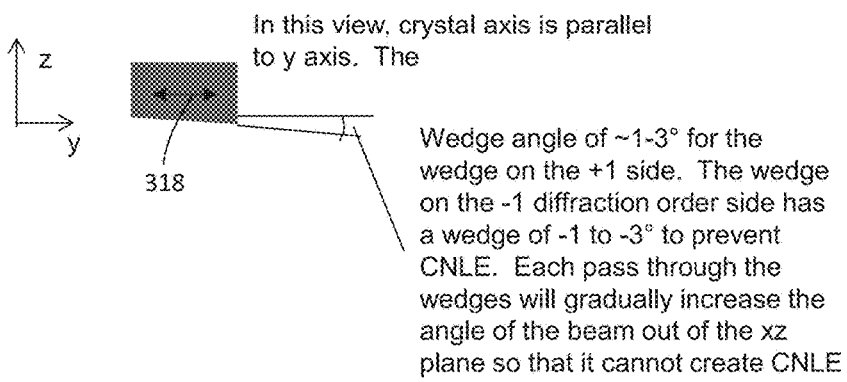

In this view, crystal axis is parallel to y axis. The

318

Wedge angle of ~1-3° for the wedge on the +1 side. The wedge on the -1 diffraction order side has a wedge of -1 to -3° to prevent CNLE. Each pass through the wedges will gradually increase the angle of the beam out of the xz plane so that it cannot create CNLE

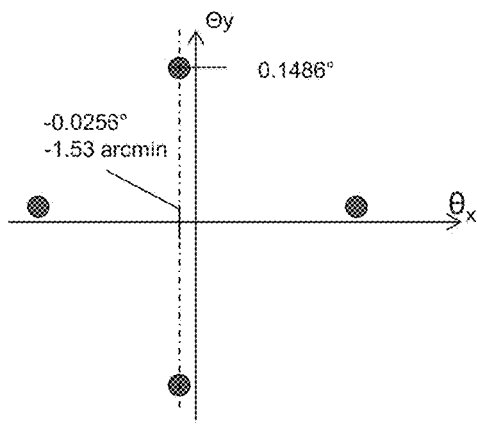

The smaller angle is for an out-of-plane wedge angle of 3°

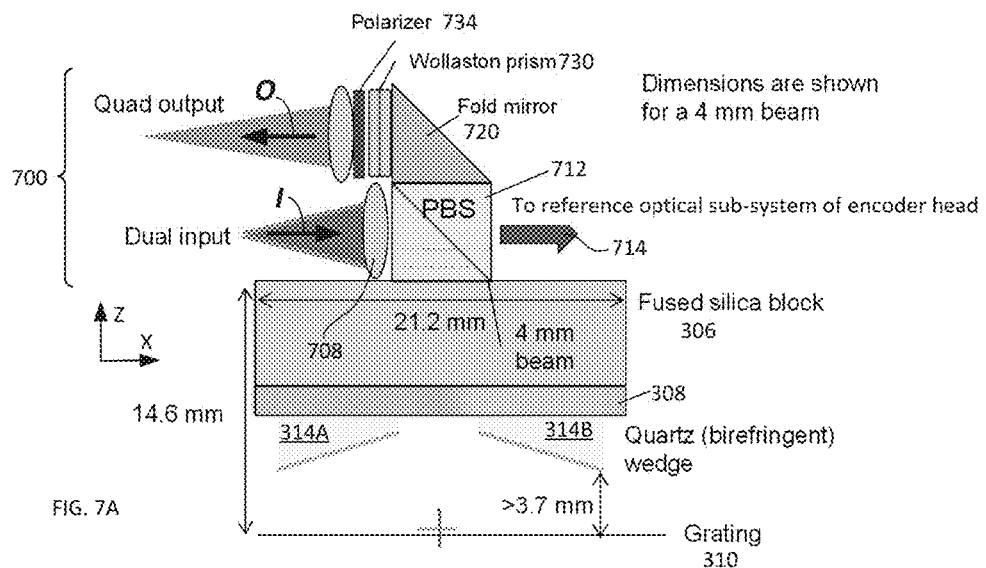
FIG. 7A
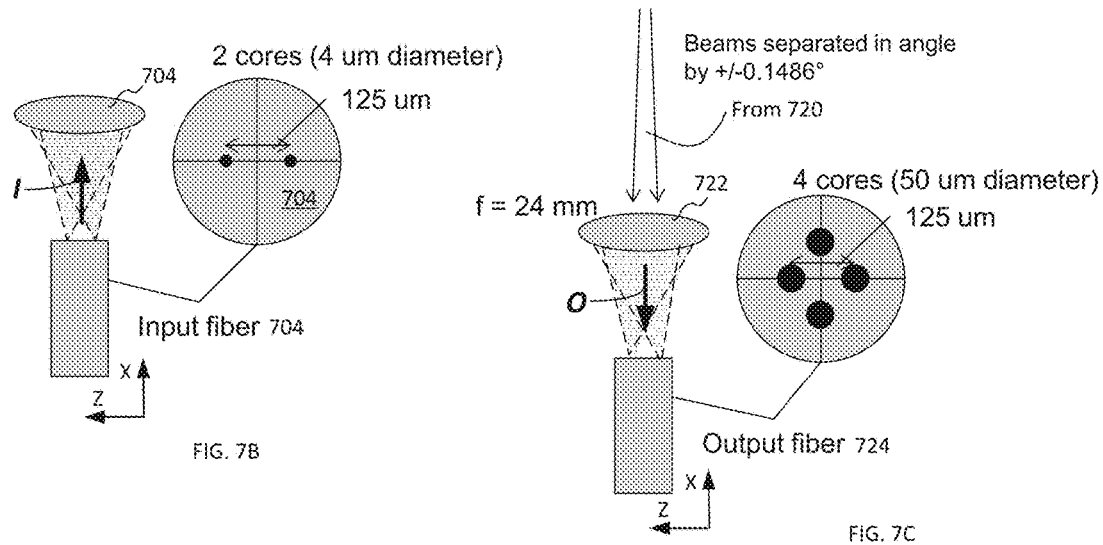
FIG. 7B
FIG. 7C

ENCODER HEAD WITH BIREFRINGENT ELEMENTS FOR FORMING IMPERFECT RETROREFLECTION AND EXPOSURE SYSTEM UTILIZING THE SAME

CROSS-REFERENCE TO RELATED PUBLICATIONS

This patent application claims the benefit of and priority from the U.S. provisional Patent Application No. 62/416,847, filed on Nov. 3, 2016, and is a continuation-in-part of the U.S. patent application Ser. No. 15/483,887 filed on Apr. 10, 2017, which claims priority from the U.S. Provisional Patent Application No. 62/320,985 filed on Apr. 11, 2016. The technical scope of this application also relates to that of the U.S. patent application Ser. No. 14/736,118 and U.S. Ser. No. 13/796,316.

The disclosure of each of the above-identified applications if incorporated herein by reference.

TECHNICAL FIELD

Embodiments of the present invention relate to systems and methods for measurement of wafer-alignment and, more particularly, to an optical encoder head for use in a lithographic exposure apparatus.

RELATED ART

Lithographic exposure apparatus (or exposure tools, for short) are commonly used to transfer images from a reticle onto a semiconductor wafer during semiconductor processing. A typical exposure apparatus, used for transfer of a pattern from a reticle onto a substrate of interest (interchangeably—a target substrate or a wafer, such as a semiconductor wafer during the semiconductor processing) includes an illumination source, a reticle stage assembly (that positions a reticle within the apparatus), an optical assembly containing the so-called projection optics, and a wafer stage assembly (that positions the target substrate or a wafer). The exposure apparatus also includes a measurement system (that monitors positions of the reticle and the target substrate) that employs an encoder head, and a control system that governs operations of various assemblies to adjust, when required, mutual positioning of the reticle and the target substrate. The geometrical features of patterns transferred from the reticle onto the target substrate are extremely small, which imposes extremely tight requirements on precise positioning of the target substrate and the reticle to manufacture high quality patterned semiconductor wafers.

Accuracy of the measurement system employed by the exposure apparatus constantly requires improvement (which is partly driven by advances in design of an exposure tool), while relatively small size, simplicity of construction, a need for reduced number of moving parts and high sensitivity remain as practical limitations.

SUMMARY

One embodiment of the invention provides for an optical system configured to retroreflect an input beam of light to form a retroreflected beam of light. Such optical system includes a combination of a substantially geometrically-perfect optically-isotropic cuboid and a birefringent optical wedge, and an optical surface disposed to redirect a portion of said input beam of light, incident thereon at a chosen location, towards said combination. The retroreflected beam of light is redirected to interact with the optical surface at the very same chosen location.

An embodiment of the invention provides for an encoder head configured for use in a lithographic exposure tool (which tool includes a wafer-stage carrying a diffraction grating). The encoder head being devoid of multiple corner-cube prisms and includes a combination of an optically-isotropic cuboid and a birefringent optical prismatic element. The combination is disposed across an initial measurement beam of light to retroreflect said initial measurement beam of light, that has impinged onto a location of the diffraction grating and then diffracted at the location, to interact with the grating at the very same location.

In a specific case, the cuboid is a substantially geometrically perfect optical cuboid and said birefringent optical prismatic element is an optical wedge. In a specific case, the combination is configured to form, from the initial measurement beam of light having a first state of polarization, a retroreflected measurement beam of light having a second state of polarization such that the first and second states of polarization are orthogonal to one another. In a specific case, the encoder head is dimensioned such that a first axis (along which the initial measurement beam of light propagates) and a second axis (along which the retroreflected beam of light propagates) are inclined with respect to one another by a non-zero angle. In a specific case, the encoder head is configured to form, from the initial measurement beam of light and in a single angle of retroreflection, a sole (only) retroreflected measurement beam of light without defining another beam of light in such act of retroreflection of the initial measurement beam of light.

A related embodiment provides an encoder head for use in a lithographic exposure system. The encoder head is devoid of multiple spatially-separated from one another optical corner-cube prisms disposed in optical communication with a given plane and includes (i) a single, substantially geometrically perfect cuboid of optically isotropic material positioned to transmit light from an input light beam, delivered to the encoder head, along an axis to interact with the plane for a first time at a first location on said plane; and (ii) a first birefringent prismatic element disposed between said plane and said single cuboid such that, aggregately, the cuboid and the first birefringent prismatic element form a system in which a first portion of light (which has interacted with the plane for the first time at the above-identified first location) is imperfectly retroreflected and then impinges onto the same plane for a second time at a second location, the first and second locations being the same location.

In yet another related embodiment, an encoder head is provided that is configured for use with a lithographic exposure system. Such encoder head contains an optical beamsplitter having an input side and first and second planar output sides; a single, substantially geometrically perfect cuboid having an input planar facet disposed parallel to the first planar output side; a single reference optical element configured to receive a second portion of said input beam of light, that has traversed the input side and the second planar output side of the optical beamsplitter; and a first birefringent optical wedge between said cuboid and said plane. The cuboid is structured and/or configured to receive along an axis a first portion of an input beam of light, that has traversed both the input side and the first planar output side of the optical beamsplitter, and to transmit said first portion towards a plane, in which plane said first portion and said plane interact at a first location.

BRIEF DESCRIPTION OF THE DRAWINGS

The invention will be more fully understood by referring to the following Detailed Description of Specific Embodiments in conjunction with the not-to scale Drawings, of which:

FIGS. 3A, 3B, 3C provide schematic illustrations of various views and components of a measurement portion of an embodiment of the invention. FIG. 3A: top view of a portion including the optically-transparent block juxtaposed with birefringent optical wedges. FIG. 3B: side view of the same. FIG. 3C: side view of an optical wedge. Here, crystal axis of the wedge is in/out of page, parallel to y axis of the Cartesian system for +/−x sides of the portion of the embodiment. (In comparison, wedges disposed at +/−y sides of the block of the embodiment have crystal axes parallel to the x axis of the Cartesian system)

FIG. 3D: top view of a plane-parallel birefringent plate configured as a non-polarizing element at a normal incidence and as a quarter-wave plate at a judiciously-defined non-zero incidence and employed in the portion of FIG. 3A; crystal axis of the plate is at 45° with respect to x, y axes;

FIG. 3E: a schematic illustration of a portion of the input/output optical unit of one embodiment of the encoder head;

FIGS. 4A, 4B provide a schematic diagram illustrating in two different views a design of a birefringent optical wedge for use with an embodiment of the invention;

FIG. 6 provides a specific example of a measure of angular deviation, of the four measurement (sub-)beams formed as a result of a double-pass off of the wafer-stage diffraction grating and propagation of input light through the measurement portion of the embodiment (of FIGS. 3A, 3B), in comparison to the direction of propagation of the input beam of light entering the measurement portion. The plot is presented in the angular system of coordinates, Θx and Θy. The location of the input beam of light in such system of coordinates (in the angular space) is at the origin;

FIGS. 7A, 7B, 7C illustrate portions and components of the input/output unit of an embodiment of the encoder head;

Figure 1:
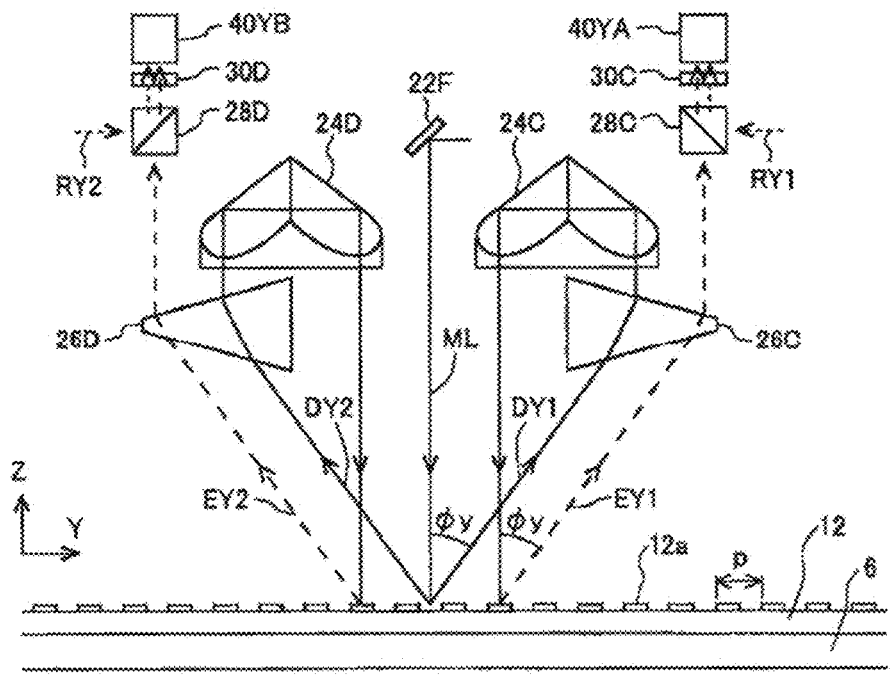
FIG. 1 is a schematic diagram of a portion of an encoder head of related art, utilizing multiple individual corner-cube reflectors and other stand-alone prismatic elements.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

While the use of lens elements at the very input and output of the system (for collimation incoming beam(s) of light that are sometimes more than one, and for coupling of light at the output of the encoder head into output fibers) may be the decided upon way to effectuate the light-input and light-output delivery steps to and from the encoder head(s), the very kernel of the encoder heads of the related art is devised and structured around the use of multiple individual prismatic elements that include multiple corner cubes. (See, for example, US 2013/0128255, US 2015/0276385, US 2014/0049762, to name just a few. The disclosure of each of the above-mentioned patent documents is incorporated by reference herein.)

As appreciated by a skilled artisan and further discussed below, a design of an encoder head that employs several independent, spatially-distinct corner-cube prisms necessarily imposes operational shortcomings on the overall encoder-head structure, among which there are large number of constituent elements/parts, structurally complex input-output optical assemblies, as well as a limited size/cross-section of the optical beam reaching a diffraction grating of the encoder head (the latter immediately translating into the smaller number of grating lines or grooves available for averaging of optical information) and the operational coupling of the sampling of a section of the diffraction grating with measurement beams on the z-position of the grating (that is, a position of the grating along an optical axis of the encoder head).

Co-assigned U.S. provisional patent application 62/320,985 (now filed as Ser. No. 15/483,887) offers examples of implementations of a light-processing portion of the optical system of the encoder head that alleviate the above-identified shortcomings by reducing the operation of the encoder head from being dependent on the use of the prism elements. The offered solution turns on the employment of a single, sole optical block configured (depending on the case—in conjunction with additional optical components) to implement an imperfect retro-reflection in the optical encoder head. The resulting optical head, at the end, employs substantially only optically-isotropic components (with a possible exception of a polarizing beam-splitter, used to diverge the measurement and reference beams of light from one another) and utilizes the measurements beams of light that interact with different, not overlapping with one another areas of a diffraction grating carried by a wafer-stage of the exposure tool. (In particular, such measurement beams of light diffract at or, as termed in Ser. 62/320,985, "pass by" the grating twice, and the areas of the grating at which such $1^{st}$ and $2^{nd}$ passes occur spatially differ from one another). There, such single, sole block is disposed close to the grating where the light beam enters and exits the retroreflecting component at about the same place, which implies that a desired imperfect retroreflection cannot be introduced without spatially-splitting the input measurement beam of light entering the system into a plurality measurement sub-beams. The measurement sub-beams, as already alluded to, interact with the stage grating at different locations along the grating. (The practical challenge, remaining in application Ser. No. 15/483,887 due to the presence of such sub-beams, is to find an easy implementation of making the sub-beams overlap and yet still have a simple way to retro-reflect them. This challenge is solved with the embodiments of the present invention.)

Instead, in related art the spatial overlap between the resulting measurement sub-beams that interact with the stage grating for the first and second time (referred to herein as the $1^{st}$ and $2^{nd}$ pass measurement beams) occurs at a spatial location at least in part defined by the location of the PBS that brings these beams back together; such spatial location of the overlap between the named sub-beams is remote, far from the grating and not on the grating itself. The operational effect of such location of the spatial overlap/interaction-with-the-grating arrangement is not necessarily the optimal one for several reasons. First, considering that the stage diffraction grating (as any diffraction grating) is not perfectly flat, and that the grating rules/lines/grooves are not perfectly-periodically spaced, the interaction of different measurement sub-beams with the grating at different grating locations necessarily amounts to different measurement errors in the plane of the grating which, in turn, translates to additional error(s) in the measurement of the axial (z-) position of the stage (as well as those in x- and/or y-positions). Second, an attempt to compensate these grating-imperfection-caused z-errors by increasing the cross-section of the $1^{st}$ and $2^{nd}$ pass measurement (sub-)beams to average over the larger number of the gratings grooves or lines (by analogy with what's done in corner-cube-prism based embodiments of the related art) translates into a larger foot-print of a stage grating itself. The latter causes, generally, an increase of the number of encoder heads per system and, therefore, affects the weight/cost/rigidity of the overall exposure system. Finally, as a skilled artisan will readily understand, determination of and compensation of geometric errors becomes more complicated when two measurement locations on the stage grating are farther apart from one another.

Embodiments of the present invention provide an improved way of achieving the design goals of optical encoder heads, one of which is an overall reduction of a footprint/operational size of an encoder head.

Embodiments of the present invention simultaneously solve a group of inter-related existing operational limitations that persistently remain in lithographic exposure systems due to the fact that a chosen measurement beam of light, produced by a conventional encoder head, interacts with a wafer-stage diffraction grating at locations that differ from one another for successive interactions. In particular, embodiments address the goals of achieving cyclic-non-linear-error-free measurement signals, the structural simplification and the reduction of the number of optical components of the encoder head, and the reduction of the overall encoder-head package size, to name just a few, by configuring an embodiment of the encoder head around the combination of a single, sole optically-isotropic block retroreflector with a birefringent optical wedge, the double-pass of which by the chosen measurement beam of light causes the locations of successive first and second interactions of such beam of light with the diffraction grating (on the first and second pass of it by the grating) coincide with one another.

The following disclosure addresses an optical system facilitating the accurate and precise determination of the positioning and/or orientation of a workpiece with respect to a chosen reference. The uses of such optical system, as well as types of a workpiece (the spatial status of which such optical system observes and/or records) are many, and while specific disclosed examples of it include the environment typical for a lithographic exposure process, the following disclosure is intended to include—and should be considered and understood as including—any applicable situation or use in which the implementations of the optical system of the invention improve and/or simplify the operation of an optical metrology system.

Figure 9:
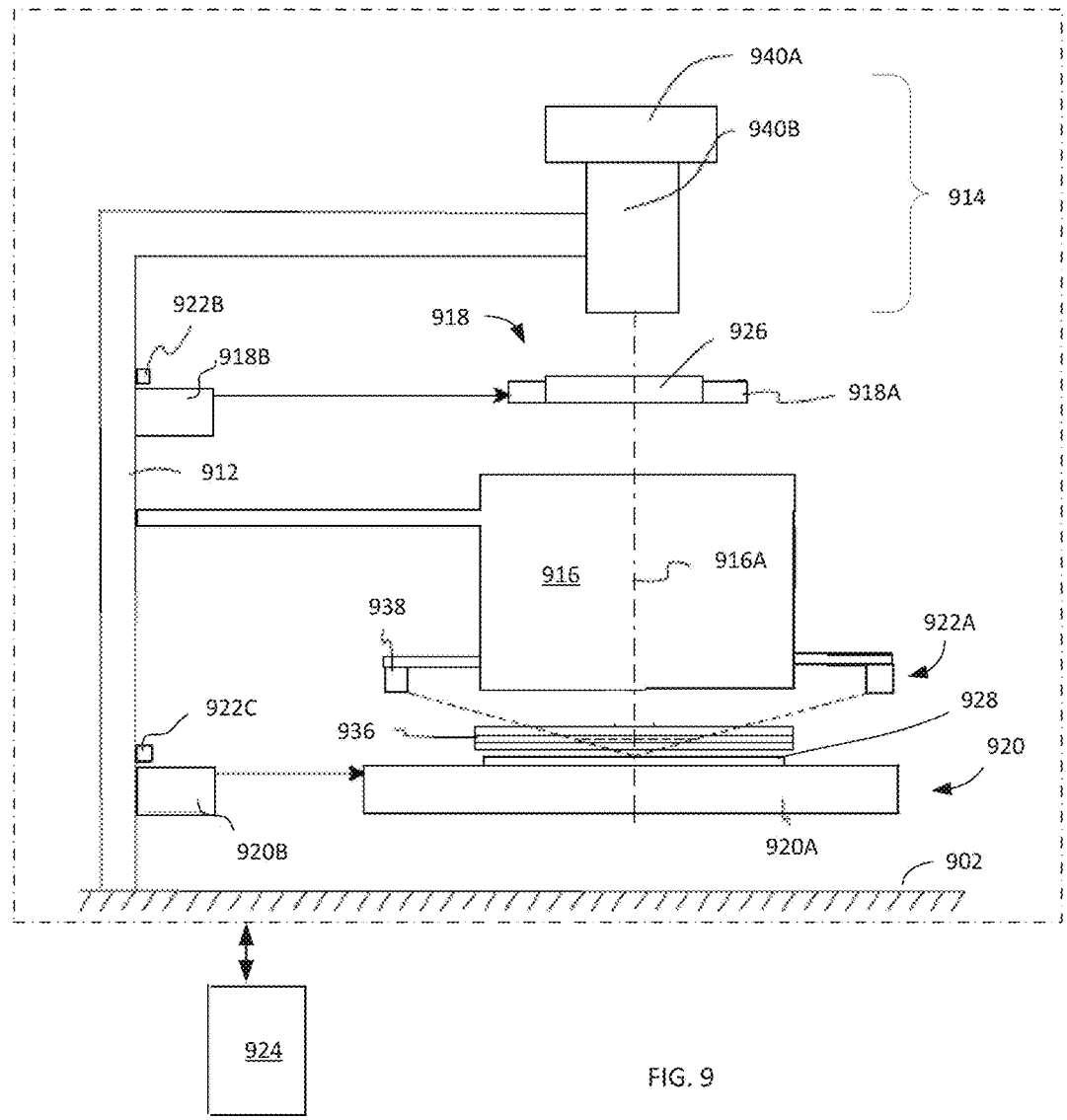
FIG. 9 is a diagram schematically illustrating but one specific application of the idea of the invention: a lithographic exposure apparatus employing an embodiment of an optical system of the invention.

To appreciate the context and operational environment of but one specific example of an optical imaging system, in which an embodiment of the proposed optical metrology tool may be used, a person of skill may find useful the following general description of a typical lithographic exposure apparatus. An example of the exposure apparatus (also interchangeably referred to as a lithographic apparatus or exposure tool)—which may employ (i) a conventional metrology system constructed around an encoder head equipped with individual corner cube retroreflectors and, optionally (ii) an autofocus system (AFS) for measurements of the workpiece displacements—is provided in PCT/US2012/043186 the disclosure of which is incorporated herein by reference. FIG. 9 schematically illustrates, in reference to the provided Cartesian system of coordinates, a schematic illustration of such exposure apparatus.

The exposure apparatus 900 includes an apparatus frame 912, an illumination system 914 (also referred to as irradiation apparatus), an optical assembly 916, a reticle stage assembly 918, a workpiece stage assembly 920, a positioning system (shown as a combination of several units including systems 922A, 922B, 922C), and a control system 924. The design of the components of the exposure apparatus 900 can be varied to suit specific requirements. The exposure apparatus 900 may be mounted to/on a mounting base 902, such as the ground, a base, or floor, or some other supporting structure.

Apparatus Frame.

The apparatus frame 912 is rigid and supports and/or houses at least the reticle stage assembly 918, the optical assembly 916, the workpiece stage assembly 920, and the illumination system 914 above the mounting base 902.

Illumination System.

The illumination system 914 includes an illumination source 940A and an illumination optical assembly 940B. The illumination source 940A emits radiation to which the wafer/work-piece 928 is exposed and which is guided by the illumination optics of the assembly 940B to the optical assembly 916, along an optical axis 916A. On its way to the optical assembly 916, the beam of radiation illuminates a portion of the reticle 926 to gain spatial pattern of irradiation representing the pattern of the reticle 926.

The illumination source 940A can be, for example, any of a g-line source (436 nm), an i-line source (365 nm), a KrF excimer laser (248 nm), an ArF excimer laser (193 nm), a F2 laser (157 nm), or an EUV source (13.5 nm). The workpiece-illuminating (exposure) light may be provided at about 193 nm (by an ArF excimer laser system, for example) light (with a wavelength of 193 nm), but it can also include ultraviolet light such as described in, for example, U.S. Pat. No. 7,023,610. The source 940A of illuminating light may exploit harmonic frequency conversion or utilize an optical-fiber based amplifier, to produce radiation at a predetermined wavelength. Alternatively, the illumination source 940A can generate charged particle beams such as an x-ray or an electron beam. For instance, in the case where an electron beam is used, thermionic emission type lanthanum hexaboride (LaB6) or tantalum (Ta) can be used as a cathode for an electron gun. Furthermore, in the case where an electron beam is used, the structure could be such that either a mask is used or a pattern can be directly formed on a substrate without the use of a mask.

Optical Assembly.

The optical assembly 916 projects and/or focuses the light passing through the reticle 926 onto the work piece 928. Depending upon the design of the exposure apparatus 900, the optical assembly 916 can scale (i.e., to magnify or reduce, with a specific coefficient) dimensions of the pattern of the reticle 926. In a specific implementation, the optical assembly 926 may simply relay the pattern of the reticle 926 onto the workpiece (i.e., have a unit magnification).

Reticle Stage Assembly.

The reticle stage assembly 918 holds and positions, (with the use of a reticle stage mover assembly 918B) the reticle stage 918A that retains the reticle 926 relative to the optical assembly 916 and the workpiece 928. The reticle stage mover assembly 918B can be designed to move the reticle stage 918A along any of the x, y, and z axes.

Workpiece Stage Assembly.

The workpiece stage assembly 920 holds and positions (with the use of a workpiece stage mover 920B) the workpiece 928 with respect to the image of the illuminated portion of the reticle 926 projected onto the workpiece. The workpiece stage mover 920B can be designed to move the workpiece 928 along any of the x, y, and z axis. In one embodiment, the workpiece 928 can be scanned while the workpiece stage assembly 920 moves the workpiece 928 along the y-axis.

Positioning System.

The positioning system (922A, 922B, 922C) monitors movement of the reticle 926 and the workpiece 928 relative to the optical assembly 916 or some other reference. As shown in FIG. 9, the position system 922 includes (i) an AFS 922A that maps the topography of the workpiece 928 relative to the optical assembly 916 along the Z axis (which is collinear with the optical axis 916A), about the X axis, and about the Y axis prior to exposure of the workpiece with improved accuracy; (ii) a reticle measurement system 922B (only a portion of which is illustrated) that monitors the position of the reticle stage 918A and the reticle 926; and (iii) a workpiece measurement system 922C (only a portion of which is illustrated) that monitors the position of the workpiece stage 920A along the X and Y axes, and about the Z axis. Due to operation of the position system, the workpiece stage assembly 920 can be controlled to position the workpiece 928 with improved accuracy. The positioning system 922 can utilize laser interferometers, encoders, autofocus systems, and/or other measuring devices.

One implementation the autofocus system 922A includes a reference system 936 providing a reference signal used in conjunction with and related to the measurement of any changing operational parameter of the AFS 922A but not the position of the workpiece 928 along the optical axis 916A. The AFS 922A further includes a measurement system 938, which provides a measurement signal used in conjunction with and related to the measurement of anything changing in the AFS 922A including (the change of, if present,) position of the workpiece 928 along the optical axis 916A. By comparing the reference and measurement signals, the position of the workpiece 928 is measured, which is accompanied with reduction of the stability requirements for many of the components of the AFS 922A.

A typical measurement system 938 may include an encoder assembly (not shown) that measures, in operation, the position of the workpiece 928 (as shown—the wafer). For example, in some embodiments, the encoder assembly can be designed to monitor and/or measure the position of the work piece along two axes (e.g., along the x- and y-axes). Additionally and/or alternatively, the encoder assembly can be designed to measure and/or monitor the position of the workpiece 928 along all three axes (i.e., to specify the 3D position of the workpiece 928).

The conventional measurement system 938 may also include a stage grating (not shown) that is secured to a side of the workpiece stage 920A (of the assembly 920) that retains the workpiece 928, and one or more fixed encoder heads (not shown). The number of encoder heads and their mutual positioning and orientation can be varied according to the design of the exposure apparatus 900 and/or the measurement system 938, and the amount of travel of the stage 920A along x- and y-axes. The use of multiple encoder heads enables the encoder assembly to more accurately measure the position of the stage 920A, and thus the position of the workpiece 928 that is retained by the stage 920A. Examples of the structure(s) of the measurement system 938 and conventional encoder head(s) are discussed in detail in U.S. 2014/0049762, which is incorporated herein by reference, and will not be addressed here in any additional detail.

Control System.

The control system 924 is operably connected to and governs the operation of at least the illumination system 914, the reticle stage assembly 918, the workpiece stage assembly 920, and the positioning system 922. The control system 924 acquires measurement data, from the positioning system 922, that represent position and/or orientation and/or movement of the reticle 926 and/or workpiece 928 with respect to the optical assembly 916 or another chosen reference. Based on these data, the control system 924 controls the assemblies 918, 920 to precisely position the reticle 926 and the workpiece 928. The control system 924 can include one or more processors and electronic circuits, at least one of which may be specifically programmed to perform steps of data acquisition, data processing, and control of operation of the components of the apparatus 900.

Generally, the exposure apparatus 900 can be used as a scanning type photolithography system for optical transfer of a spatial pattern from the reticle 926 onto the workpiece 928, with the reticle 926 and the workpiece 928 moving synchronously. Alternatively, the exposure apparatus 900 can be used as a step-and-repeat type photolithography system that exposes the reticle 926 while the reticle 926 and the workpiece 928 are stationary. The use of the exposure apparatus 900, however, is not limited to a photolithography system for semiconductor manufacturing and can include, as a non-limiting example, the use as an LCD photolithography system that projects a liquid crystal display device pattern onto a rectangular glass plate or a photolithography system for manufacturing of a thin film magnetic head.

Figure 2A:
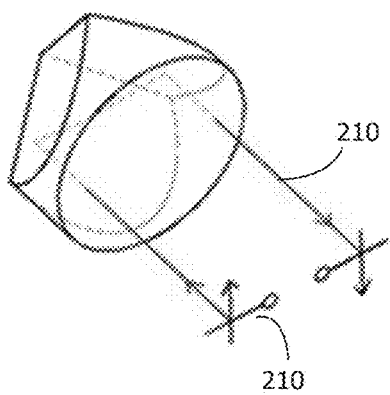
FIGS. 2A, 2B provide schematic examples of typical corner-cube structures.
Figure 2B:
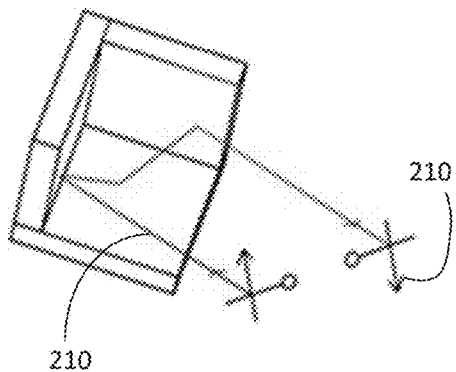

Conventional Use of Individual Corner-Cube Reflectors in a Metrology Tool and Related Cases In order to measure x-, y-, and/or z-coordinates or other positional parameters of a stage carrying an object or a workpiece (and, in a very specific case, those of a wafer-stage) moving in the reference system of the exposure tool during its operation, a two-dimensional (2D) diffraction grating is typically employed in conjunction with such stage. This grating may be interchangeably referred to below as a stage grating (and, when the workpiece of interest is a wafer—a wafer-stage grating). Each light beam that is nearly normally incident onto such grating forms, in diffraction at the grating, four primary first-order-diffraction beams: two diffracted beams representing respectively +/−1 orders of diffraction in the xz-plane and two diffracted beams representing respectively +/−1 orders of diffraction in the yz-plane. Light efficiency is rather critical during the measurement of the wafer-stage positioning, so ideally all four of these first-pass diffraction orders are used as part of the measurement (as opposed to creating multiple first pass beams, one for each measurement). The basic principle of such measurement requires the measurement light beam to pass off/be diffracted by the stage grating twice (while being retroreflected towards the grating in between the two occurrences of the diffraction) so that any change of tip or tilt of the grating does not result in or cause a corresponding tip or tilt of the measurement beam of light. This is where the related art took advantage of the use of corner-cubes to effectuate such retroreflection. See, for example, FIG. 1 (corresponding to FIG. 2B from U.S. 2013/0128255), which shows the use of four individual constituent corner cubes and four shear-correction prisms required to effectuate four measurements, in the xz- and yz-planes, based on a single input beam of light. (For description of all optical elements and the overall system of FIG. 1, the reader is referred to the description of FIG. 2B of U.S. 2013/0128255). Notably, all these optical elements have to be tediously aligned relative to one another to provide for accurate and reliable measurement(s).

For the purposes of this disclosure, and as understood in the art, a corner cube (or a corner-cube prism) is defined as a stand-alone optical component with the unique ability to turn the beam incident thereon by an angle of 180 degrees (which, in in a specific case, may result in returning the beam directly towards the point of origin of such beam), regardless of the beam's angle of entry into the corner cube. Diagrams of a typical corner cube are provided in FIGS. 2A, 2B, where arrows 210 indicate either input or output beams of light and schematics 214 illustrate the preservations or change of parity and orientation of an image formed in light reflected by the corner cube with respect to those of an object.

General Considerations

Encoder heads of the related art, configured for measuring the position of a wafer stage with sub-nm accuracy, are typically structurally complex and require the use of many optical components and/or tight operational tolerances and difficult alignment of such components. Optical engineers find themselves in a tight spot in attempt to satisfy several operational requirements that must be met for an encoder head to work properly, while continuing the quest for reducing the complexity and cost of the encoder heads. The typical operational requirements include:

1. Two passes, of the measurement beam of light, off or by the measurement diffraction grating (stage grating) with a retroreflection occurring in between these two passes, in order to remove tip/tilt errors from the measurement beam;
2. Making the above-mentioned retroreflection spatially/angularly imperfect to help prevent parallel stray beams from being introduced into the light-measurement system;
3. Utilizing the measurement beam with the largest diameter possible (for a given encoder head package size) to average the results of the measurement over as many grating grooves/rulers/line as possible; and, last but not least,
4. Achieving high light efficiency (as a 2D diffraction grating is at best about 20% efficient on each of the 2 passes of the measurement beam of light by the grating).

A person of skill in the art is also often concerned with some optional requirements, the satisfaction of which is sometimes desirable. These include:

1. Reducing the size of the resulting encoder head package to the smallest possible;
2. Overlapping the $1^{st}$ and $2^{nd}$ pass measurement beams at the same spatial location on the grating, to minimize geometric errors and grating size (that is, achieving the smallest possible beam footprint);
3. Reducing the number of utilized optical components;
4. Increasing the relative ease of alignment by utilizing double pass elements, etc.;
5. Utilization of all 4 diffraction orders from the $1^{st}$ pass beam (to increase light efficiency), and
6. Ensuring the operational ease of fiber-centered input/output of light into the encoder head unit (if such input-output is, indeed, employed).

The appreciation of the fact that additional, reference light beams are also necessarily present/formed in the encoder head system begs additional questions: is it required for such reference beams of light to be also incident on/interact with the diffraction grating, thereby removing z- (that is, axial) sensitivity of the measurement? Can the reference beams of light be generated with high efficiency while requiring minimal space in the package of the overall encoder head? All these are the considerations and motivations behind the design of the embodiments discussed below.

In certain embodiments the encoder head assembly, configured according to the idea(s) of the invention, enables such operational and/or structural features as: (i) improved sensitivity to the workpiece-stage displacement in reference to the encoder head; (ii) improved light efficiency; (iii) inhibition of a cyclic non-linear error (CNLE), or stray light rejection; (iv) minimal non-common beam path; (v) minimal number of stand-alone output optical fibers; (vi) reduced in size and complexity optical assembly of the encoder head for a given diameter of the measurement beam.

The idea of the present invention is based on the realization that configuring the encoder head around the use of a single, solid optical block of glass (instead of a multiplicity of distinct prismatic elements) to effectuate the double-pass retro-reflection of light within the encoder head greatly reduces the required number of high-quality optical components in comparison with that used in the related art, mitigates the stray noise, and simultaneously allows for increase of size of the measurement beam of light, thereby solving at least these the structural and operational problems remaining in exposure systems of the related art.

The discussed-below implementations solve the problems of establishing the CNLE-free measurement signals, a small number of simple optical components, a small overall package size and overlapping all measurement beams on the same grating location by defining an assembly in which birefringent optical wedges are combined with/complement an optically-transparent sole block optically-isotropic light-retroreflector into a compact encoder head while overlapping the $1^{st}$ and $2^{nd}$ pass beams on or at the measurement grating.

Unless specified otherwise, the terms "single element", "single optical element", "sole element" and similar terms are defined to refer to an optical body that is monolithic—that is, consisting of one piece (solid or unbroken, as opposed to one integrated or constructed from several pieces each of which has, on its own, identifiable geometrical boundaries) of the same, single optical material—and that is characterized by spatially uniform optical and mechanical properties. Accordingly, an optical element formed as a result of combining several individual optical elements into one integral whole is not considered to be a single and/or sole optical element as defined herein.

In particular, the implementations of the present invention solve problems of (i) structural complexity of a conventional encoder head for use in an exposure tool and (ii) burdensome alignment of the multitude of optical prisms in the process of forming such encoder head by substituting the multiplicity of corner-cubes with a single, substantially geometrically-perfect cuboid of glass that, in operation with the diffraction grating of the workpiece-stage, simultaneously forms four interferometric signals for measuring x-, y-, and z-positions of a stage grating relative to the encoder head. Unless specified otherwise, the term "cuboid" is used to define a parallelepiped of which all faces are rectangular. The term "substantially geometrically perfect", when used in reference to a shape of a particular optical body, denotes a minimized deviation from the otherwise-determined or known shape of such body as accepted in results of fabrication of such body employed as known in the art. One example would be an optical cube with a corner as a result of internal reflection at which the beam of light is returned along the same axis along which it arrived when impinging on the corner, with a possible angular deviation not exceeding, for example, 3 arcseconds (or, sometimes, even 1 arcsecond); the edges of such optical cube are not beveled, since the incident beam is nearly centered on the corner of the cuboid.

Non-Limiting Examples of Implementation

FIGS. 3A, 3B, 3C, 3D illustrate a central part 300 of an embodiment of the measurement portion of the proposed configuration of an encoder head, the implementation of which requires only 6 pieces of optically-transparent material to effectuate two measurements in x-direction and two measurement in y-direction (the optical portion of the encoder head configured to handle the reference beams is not shown). FIG. 3E shows schematically a dual-beam input unit, appended to the central part 300 to bring in light to the measurement portion from the outside of the encoder head.

Figure 3A:
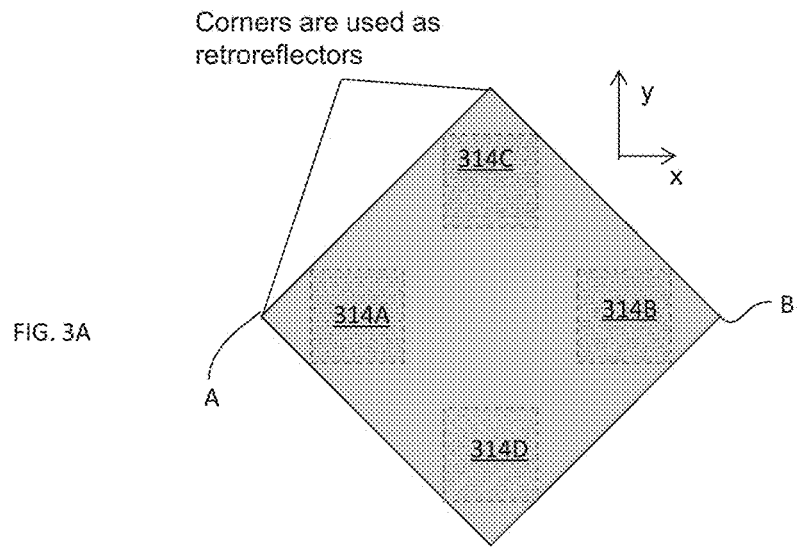
Figure 3B:
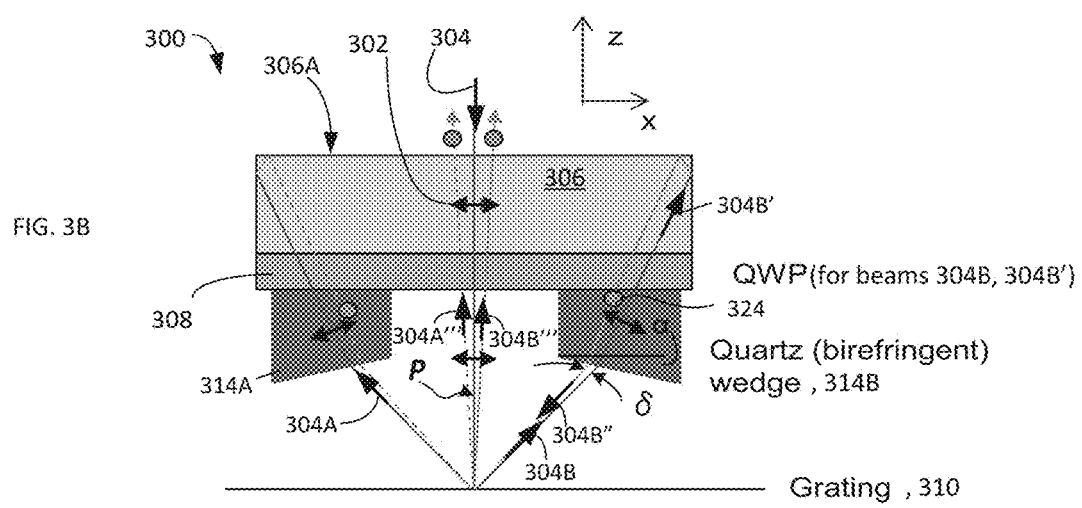

In reference to FIG. 3B, showing the optical transformations occurring in the central portion of the encoder head in the xz-plane only, linearly polarized (in the plane of the page, as shown with an arrow 302) beam of light 304 is normally incident in the −z direction onto the optically-isotropic single, sole block 306 of optically-transparent material (in a specific example, configured as a substantially geometrically-perfect cuboid made of, for example, fused silica) and then transmitted through the block 306 and an optically anisotropic component 308, positioned underneath the block 306, towards the stage diffraction grating 310 (which is not considered to be part of the encoder head 300). As shown in FIG. 3E, light in the form of the input beam 304 may be initially delivered to the central part 300 from the dual-input unit (containing a dual-core optical fiber or two optical fibers) through the polarizing beam splitter, PBS, that splits such light into the measurement portion and the reference portion in a fashion substantially similar to that illustrated in Ser. No. 62/320,985, incorporated herein by reference.

The angle of incidence of the beam 304 onto the upper surface 306A of the block 306 (as defined with respect to the normal, drawn to the surface 306A) is substantially zero. In a specific example, the component 308 is a plane-parallel plate of a birefringent material configured to have its crystal axis 312 oriented at 45 degrees with respect to the x- and y-axes (as illustrated in FIG. 3D) such as to introduce different phase delays to a beam of light such as the beam 304 and another beam, the vector of linear polarization of which is normal to that of the beam 304. The perimeter or contour of the plate 308, as seen along the z-axis, is marked 308A. Two respectively-corresponding corners of each of the block 306 and the component 308 are marked A, B to indicate how the elements 306, 308 are oriented with respect to one another. Four optically-anisotropic prismatic components 314A, 314B, 314C, 314D (referred to herein as "wedges"), in one example made of a birefringent material such as quartz and dimensioned as discussed below, are disposed in the corner areas of the component 308 such as to be separated by the component 308 from the block 306, as shown. On its initial descent towards the grating 310, the input measurement beam 304 traverses the combination of the block 306 and the component 308 without interacting with any of the wedges 314A through 314D, as shown in FIG. 3A. A portion of the grating 310 is additionally shown overlapped with the view of the plate 308 in FIG. 3D, to illustrate that the orientation of the grooves/rules/lines of the grating 310 is along the xy-axes of the adopted coordinate system of the embodiment.

In practice, the upper surface of the component 308 and the lower surface of the block 306 may be disposed in optical contact with one another, or alternatively spaced apart. Alternatively or in addition, the upper surfaces of the wedge 314A through 314D and the lower surface of the component 308 may be in optical contact or spaced apart. (In either of these cases, it may be desirable to introduce an appropriate anti-reflection thin-film coating between the facing each other surfaces of the immediately-neighboring optical element, to reduce parasitic reflections of light within the encoder head 300.)

Noteworthy is the fact that the polarization state of the beam 304 at a point P (that is, upon traversing the block 306 and the component 308) remains linear, 302, because by design the thickness of the component is judiciously chosen such that there is an integer number of waves of phase delay between the beams with s- and p-polarizations for normally incident light at the wavelength of choice (in one example, 632.8 nm).

The 2D grating 310 then forms the +1/−1 order diffracted beams in both the x- and y-directions (the two of these four diffracted beams—beams 304A, 304B—are shown in FIG. 3B). In practice, the entire combination or unit 300 (of the elements 306, 308, and 314A through 314B) may be tilted slightly (on the order of about 0.2°, for example) about x- and/or y-axes to prevent the 0th order diffracted beam, formed by the beam 304 as a result of the first interaction with the grating 310, from providing optical feedback to the component 308 and then reflecting off the bottom surface of the component 308 and creating CNLE-beams between the embodiment 300 and the grating 310.

Considering the following propagation of only one beam, for the simplicity of illustration, the beam 304B is returned towards the contraption 300 to enter it through the lower surface of the corresponding birefringent prismatic element 314B and to propagate further through the element 314B, through the component 308, and through the peripheral volume portion of the block 306 towards a respective block's corner. (Similar events are experienced by the beam 304A as well as any of the two remaining first-order diffraction measurement beams formed and propagating in the yz-plane; not shown.)

To appreciate the optical parameters and details of relative orientation of the beams of light propagating through the embodiment 300 and the constituent component of the embodiment 300, one should consider the structure and dimensions of the birefringent prismatic elements 314A, 314B, 314C, 314D. Using the prismatic element 314B as an example, and in reference to FIGS. 3C, and 4A, the lower surface of the element 314B (i.e., the surface through which light from the beam 304 enters the embodiment 300 after the first pass off of the grating 310—in the form of the beam 304B) is "wedged" or inclined at a first non-zero angle α relative to the x-axis and a second non-zero angle β with respect to the y-axis. (In a specific embodiment where the wavelength of light of the beam 304 is about 632.8 nm and the element 314B used in the xz-plane is made of quartz, α~17°, β~1° . . . 3°. Details are shown in FIG. 4A. The lower surface of the oppositely-disposed wedge 314A is tilted in the same direction.) The crystal axes of the prisms 314A, 314B are each parallel to the y-axis and indicated as 318, so the beam 304B is refracted at the lower surface of the prism 314B and the lower surface of the component 308 at an angle that can be devised from the Snell's law for the beam's polarization, orientation of the crystal axes as well as refractive indices of the elements 314B, 308. (Notably, the inclinations of the lower surfaces of the wedges 314C, 314D—not shown—are the same as those of the prisms 314B, 314A, so overall the embodiment 300 utilizes two pairs of birefringent wedges—two wedges dimensioned as wedge 314B, and two wedges dimensioned as wedge 314A.)

Upon the transmission through the wedge 314B (that does not affect the linearity of the polarization state of the beam 314B), the linearly polarized light from the beam 304 continues to propagate through the component 308 at an internal, with respect to the lower facet of the component 308, angle of about 30.5° (which is a specific numerical value corresponding to the component 308 being made of quartz and the wavelength of light being about 632.8 nm). The thickness t of the component 308—which, as has been already alluded to above, is chosen to not alter the polarization state of the input beam 304 propagating therethrough at a normal incidence—is, at the same time, chosen to turn the component 308 into a quarter-waver plate (QWP) at an angle of propagation of the beam 304B through it. (In a specific example, as discussed below, t~1.67 mm.) Accordingly, the plane-parallel optical plate of the birefringent component 308 introduces a quarter-wave of optical path difference (OPD) for s- and p-polarizations of light, and so the linearly-polarized beam 304B emerges from it into the block 306 as beam 304B' that is circularly polarized. The beam (in this design, with the nominal diameter of about 4 mm) is then incident roughly centered in the corner K of the fused silica block 306 (of nominal thickness of about 6 mm), and is retroreflected towards the second pass through the component 308). The edges of the cuboid 306 are preferably held parallel to one another within the tolerance angle below 1 arcsecond (and generally below 3 arcseconds), and are kept sharp (not beveled) so as to minimize the diffraction effects from the beam being incident on the edges. In addition, the corners of the fused silica block 306 may be all coated to reflect the light without inducing any retardation of light, as knows in the art.

The beam 304B' is returned to the plane-parallel plate 308 at the same angle as that at which is emerged from it (having retroreflected in the corner of the block 306) and, upon the second propagation through the plate 308 towards the wedge 314B), the circular polarization state of the beam 304B' is converted into the linear polarization the vector of which is perpendicular to the vector of linear polarization of the beam 304B, as shown by the numeral 324. Therefore, on its return towards the grating 310 from the block 306, retroreflected at the block 306 light from the input beam 304 encounters the quartz wedge 314 while in the orthogonal polarization state and is, therefore, refracted on the $2^{nd}$ pass through the wedge 314B in a fashion that is different from the fashion of refraction upon the $1^{st}$ transmission through this wedge. Such difference in refraction leads to the difference in a direction of propagation of the beam 304B" upon its return to the grating 310—the difference, shown in angular space as a non-zero angle δ, thereby manifesting the imperfect retroreflection of light (diffracted at the grating 310 upon the first pass off of the grating) in the embodiment 300.

The beam 304B", carrying light from the input beam 304, is incident again, for the second time on the grating 310 and (upon such $2^{nd}$ pass off of the grating 310) is diffracted towards the lower surface of the plate 308 as beam 304B''' at an angle slightly different from that at which the input beam 304 arrived to the grating 310 to begin with. As a result, the beam 304B''' is incident onto the lower surface of the plane-parallel plate 308 non-perpendicularly and in a state of polarization that is orthogonal to the state of polarization of the beam 304. The net result for a quartz wedge 314B with a 17° wedge angle is an output beam 304B''' propagating outwardly from the upper surface 306A at an angle of about 0.1486° with respect to the z-axis.

It is appreciated that similar transformations of the polarization state and the directions and/or orientations of the vector of propagation is experienced by the +1 order of diffraction (beam 304A). Upon the exit from the upper surface 306A, therefore, the +1 and −1 orders of diffraction of the beam 304 formed at the grating 310 in the xz-plane will be deviated from the input beam 304 by +/−δ (about +/−0.1486°, in one numerical example), respectively. +1 and −1 diffraction order beams formed from the input light 304 at the grating 310 in the yz-plane will, for the same reason, be also deviated angularly with respect to the input beam of light, although not necessarily by the same amount. All four output measurement beams are further arranged to be outcoupled into separate output optical fibers (in one implementation—multimode fibers), as further discussed below.
Examples of Some Structural Details.

(A) the Birefringent Plane-Parallel Plate 308.

The thickness of the plate 308 (which is configured to operate as a quarter-wave plate for the +1/−1 order diffraction measurements beams propagating within the embodiment 300 after the first pass off of the grating 310) is determined by the material properties of the plate 308 itself and the wedge angle(s) of the prismatic element(s) 314A through 314D. In one example, the plate 308 is made of quartz, with $n_o$ of about 1.5426 and $n_e$ of about 1.5517 at an example wavelength of 632.8 nm.

Figure 5A:
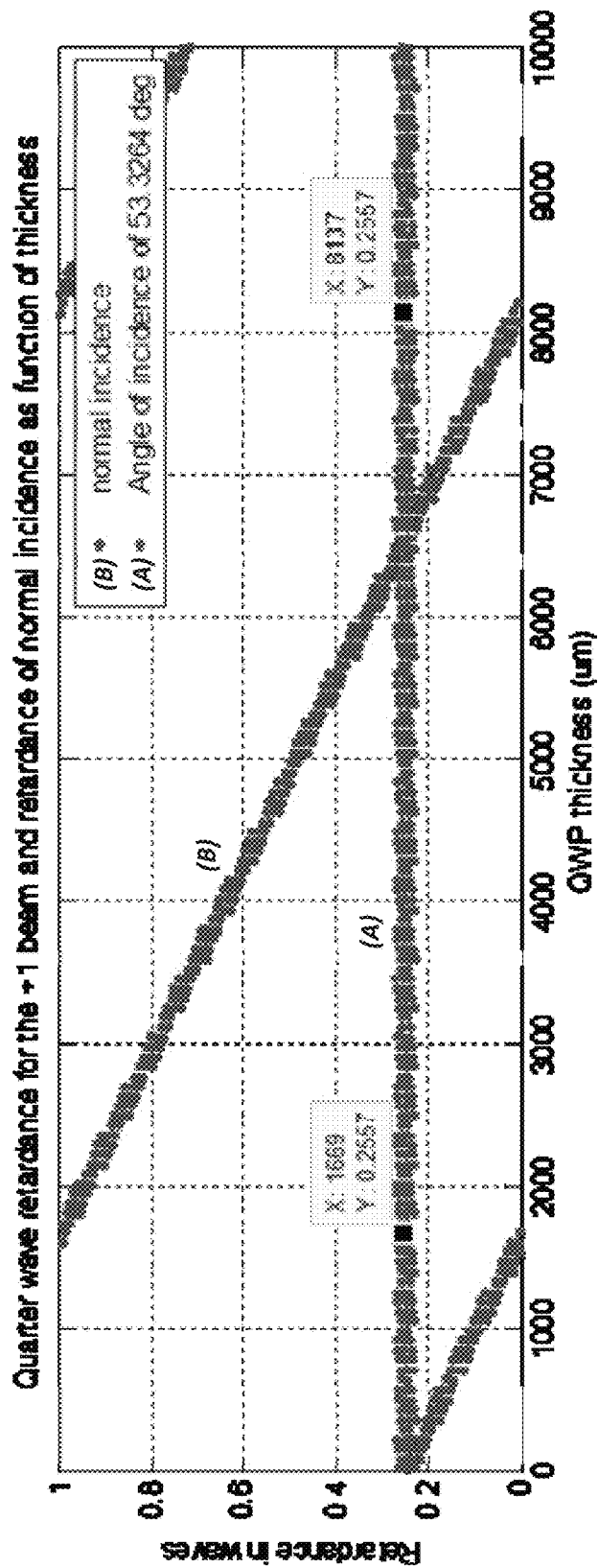
FIG. 5A contains a plot illustrating optical retardation provided by the plane-parallel birefringent plate of FIG. 3D (configured as a quarter-wave plate for a non-zero angle of incidence thereon of a +1/−1 diffraction order measurement sub-beams) and a plot showing a thickness-dependent optical retardation in the same plate corresponding to the normal incidence of light onto the plate as a function of thickness.
Figure 5B:
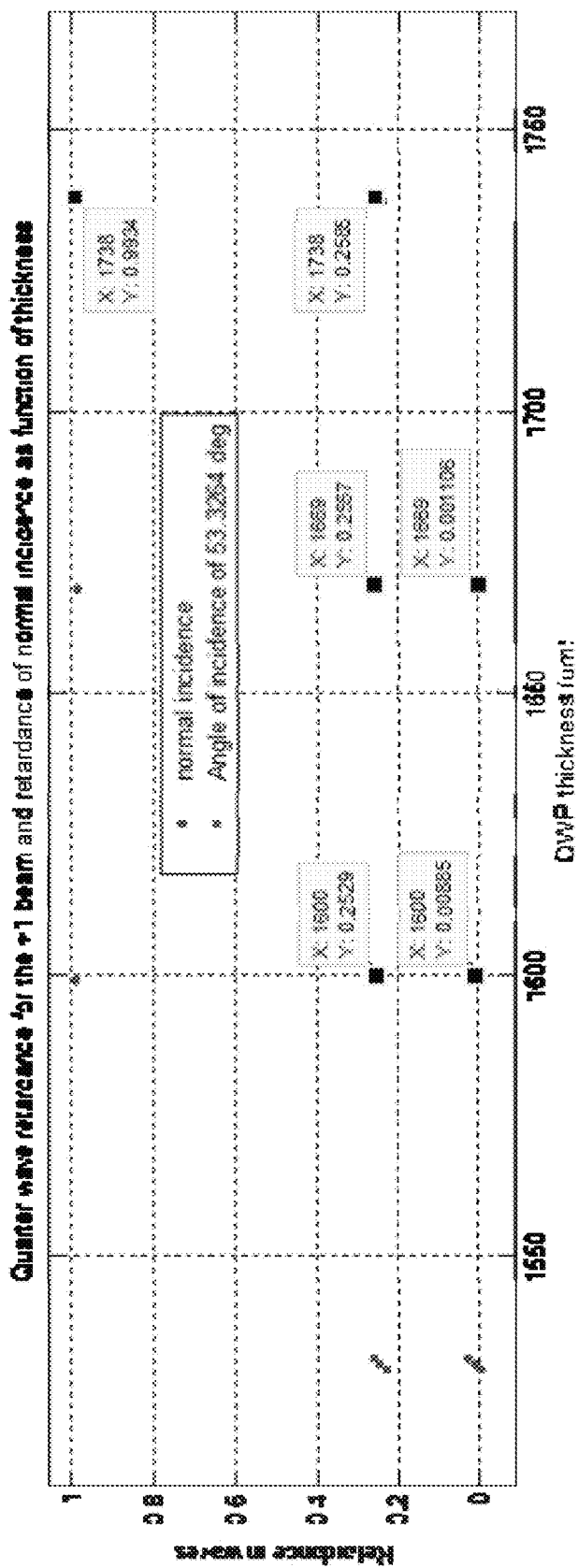
FIG. 5B a portion of the plots of FIG. 5A, for a nominal thickness of the plate of FIG. 3D in the vicinity of 1.67 mm. As indicated, in this specific non-limiting example the actual thickness of the QWP needs to be either 1.60, 1.669, or 1.738 mm to obtain a waveplate-like performance at a specified non-zero angle of incidence with the desired non-polarizing properties at the normal (zero-angle) incidence for the wavelength chosen.

FIG. 5A shows the measure of optical retardation (expressed, in optical waves at the wavelength of about 632.8 nm, for light at ordinary and extraordinary polarizations) caused by the quartz plane-parallel plate. Plot (A) illustrates such measure for the case when light at 632.8 nm is incident onto the quartz plate at an angle (in air) of about 53 degrees (which corresponds to the beam 304B, that has traversed the wedge 314B with a corresponding wedge angle of about 17 degrees). For such light, the quartz plate 308 operates as a quarter-wave plate by design (as already discussed above). Plot (A) is formed by the discrete set of data points (thickness values) corresponding to a beam retardation caused by the plate 308 for the chosen angle of incidence in air (within a practical error of about +/−2%). In practice, the corresponding measurement beam of light propagates through the QWP 308 at an internal angle of about 30.5°, and emerges from the QWP 308 as beam 304B' (see FIG. 3B). The second plot of FIG. 5A—plot (B)—shows the optical retardation measure for a beam of light at 632.8 nm incident onto the plate normally (for discrete values of thickness, presented within the range from 0 to 1 waves). In practice, therefore, this plot (B) corresponds to the optical retardation imposed by the plate 308 on the beam 304. (Alternatively or in addition, plot (A) may be thought of as one corresponding to thicknesses of the quartz plate 308 that is configured as a QWP but for a specific angle of about 53 degrees. Then, for such thicknesses, plot (B) shows the phase delay for a normally incident beam of light. Note that for both plots, the fractional waves of retardation is all that is shown: in practice, there are many full waves of retardations corresponding to each point on each plot.) A person of ordinary skill in the art will readily appreciate that, in choosing the practical thickness of the component 308, one should be guided by the thickness values that are determined at or around the points where the value of the plot (B) is either 0 or 1, which in this example are those about 1.669 mm and 8.137 mm. In the interest of making a practically-sized encoder head, the thinner value may be chosen in one implementation. Zooming in on that region of FIG. 5A (the results of which are shown in FIG. 5B), the thickness of the plate 308 can take one of a few values of 1.600 mm, 1.669 mm, or 1.738 mm (all values determined within an error range of about +/−1 micron, which is known to be within the reach of practical thickness tolerances achieved by manufacturers of commercial waveplates). Accordingly, in related embodiment the quartz plate 308 having thickness of 1.600 mm, 1.669 mm, or 1.738 mm is configured to implement a QWP for the +1 and −1 diffracted beams 304B, 304A, while, at the same time, to act like a regular optical window (introducing no phase delay) for a nearly-normally incident light of the beam 304.

It should be noted that as the stage grating 310 tilts, the angle of incidence of the diffracted beams 304A, 304B at the plate 308 change, and therefore the optical retardation introduced by the plate 308 changes as well. The thicker the QWP 308, the larger the change of the optical retardation with tilt-angle. For a quartz plate, the measure of such change in retardation is about (0.005λ/degree*mm). So for a 1.7 mm thick plate with a tilt change of +/−1 mrad (full range of 0.11°, which is within the typical tolerance of the angular positioning of the workpiece-stage in a lithographic exposure tool, for example), the total change in optical retardation is 0.005λ*1.7*0.11=0.0009λ full range. Such practically-negligible amount of the change in the value of optical retardation introduced by the component 308 convincingly demonstrates the operational stability of the embodiment with respect to the tip or tilt of the workpiece-stage carrying the grating 310.

(B) Birefringent Prismatic Elements 314A, 314B, 314C, and 314D.

Referring again to the two diagrams of FIGS. 4A and 4B, the quartz wedges were discussed as being wedged in two planes—the xz-plane by about 17 degrees and in the yz-plane by about 1° to 3°, with the wedges (which, geometrically, are configured to be mirror images of one another) setup to point in opposite directions during the operation of the system for the +1 and −1 diffracted beams. Such configuration has several consequences. First, any beam reflected multiple times by the bottom of any of these wedges will continuously increase its angle of propagation with respect to the xz-plane with an advantageous result that such beam does not contribute to stray, undesired light within the encoder head. In addition, a stray beam that reflects off the grating on the second pass (+1, 0, −1 beam) will not end up parallel to the (−1,−1) beam because of these opposite wedge angles. A stray light analysis of the design shows that the highest power stray beam has a relative power (as compared to the input measurement beam 304) of about 1e−7, which is practically so low as to not cause operational problems in the phase measurement of the interferometric signal produced at the output of the encoder head. In addition, the dual inclination of the lower surfaces of the prismatic elements 314A, 314B, 314C, and 314B (shown in two diagrams of FIG. 4A for the wedge 314B) implies that each of the four measurement sub-beams returned towards the PBS through the plate 308 and the block 306 upon the second pass (diffraction) off of the grating 310 is angularly deviated from the input beam 304 and, therefore, can be easily separated as an output beam from the input beam with the input/output beam contraption further discussed below in reference to FIGS. 7A, 7B, 7C. (This includes the two output beams 304A''' and 304B''', produced by input light 304 diffracted by the grating 310 in the xz-plane, as shown in FIG. 3B, and the two output beams produced by the same input light diffracted by the grating in the yz-plane, not shown.) The illustration of angular deviations of the four output measurement (sub-)beams in a plane orthogonal of an optical axis of the output beams is presented in FIG. 6. (The exact numerical values of such angular deviations depend on the materials and geometries of the constituent components of the system 300, discussed above.)

(C) The Light Input/Output Unit

FIGS. 7A, 7B, 7C show, in the xz-plane view, a basic diagram of an input/output unit 700. A dual polarization-maintaining (PM) input fiber component 704, where the fast axes of the two individual waveguiding channels are oriented 90 degrees relative to each other, is used to deliver the input light I. The input collimating lens 708 creates two collimated beams, the optical axes of which are inclined with respect to one another by about 0.5° to 1.0°, depending on the focal length of the lens 708 and the separation between the individual cores of the fiber component 704. The PBS 712 (nominally 5 mm on a side) relays a portion of the input light I (that has arrived from one input of the dual input unit) in the form of the measurement beam 304 towards the grating 310, while another portion of the input light I (that has arrived from another input of the dual input unit) in the form of the reference beam 714 is relayed to the reference arm of the encoder head (not shown). The measurement side/portion of the encoder head, as was discussed above, transforms the input beam 304 as a result of several occurrences of diffraction, imperfect retroreflection, and rotation of the initial polarization state of the input beam 304 to form 4 measurement (sub-)beams (see FIG. 6) that are returned from the measurement portion of the encoder head towards and again transmitted through the PBS upon return along the z-axis. The returned measurement (sub-)beams are then folded by the reflector 720 to form the aggregate light output distribution O to be coupled, through the lens element 722, into the quadruple output fiber 724.

Since the determination of the change of at least one of the position and orientation of the workpiece-stage, carrying the grating 310, is made based on the analysis of the interferometric signal derived from the output O by data-processing circuitry of overall exposure system (as would be readily recognized by a skilled artisan), the purpose of the reference portion (subsystem) of the encoder head, not shown, is to generate 4 reference beams and return them towards the PBS 712 in a fashion similar to that of the measurement portion 300, for further spatial overlap with the measurement (sub-)beams. The group of the four reference (sub-)beams is characterized by the same output angles as those shown for the measurement (sub-)beams in FIG. 6; each of the four measurement (sub-)beams has substantially the same power as a corresponding one from the group of the four measurement (sub-)beams. The polarization states of the reference (sub-)beams prior to impinging on the PBS 712, however, are orthogonal to those of the measurement (sub-)beams. As a result, the PBS 712 reflects the returned reference (sub-) beams towards the reflector 720, along the z-axis. The process of further optical relay of the reference sub-beams towards the output fiber 724 is the same as that of the measurement (sub-)beams.

As the operation of the reference portion of the encoder head also involves retroreflection of light so that pointing changes of the input fiber don't ruin the alignment, and so a Wollaston prism 730 is additionally used in the unit 700 to orient the respectively-corresponding measurement and reference (sub-)beams parallel to one another (i.e. all 4 reference beams will have an anglular bias in the same direction that needs to be removed; such angular bias is removed by the Wollaston prism). Finally, an optical polarizer 734 with an axis at 450 to each of the polarization states of the measurement and reference (sub-)beams is positioned across the optical axis to ensure that light outputs from both the measurement and the reference portions of the encoder head have the same polarization states before the lens 722 so that they can interfere and produce interference signal that is further processed by the data-processing circuitry appended to the distal end of the output fiber unit 724. (The orientation angle of the axis of the polarizer 734 generally can be other than 45° if it helps match the relative power in the measurement reference beams for optimal interference signals.)

The output fiber unit 724 may, generally, be represented by separate individual multimode output fibers. FIG. 7C illustrates a related specific version, in which a 4-core multimode fiber component is used, having four 50 micron cores disposed at a center-to-center spacings of about 125 microns, to match the focusing of the output (sub-)beams by the lens 722 with a focal length of f=125/(tan(2* 0.1486°))=24 mm.

Each of the input and output channels of the unit 700 may additionally contain a set of Risley prisms (between the facet of the corresponding optical fiber unit and the PBS 712, not shown) to change the tilts of optical beams passing therethrough, if required. In its simplest form, the reference optical (sub-)system of the encoder head can be structured in a fashion substantially identical to that of the measurement portion. Alternatively, the reference optical portion of the encoder head can be configured in a more conventional fashion, with the use of individual corner-cube retroreflectors (which, understandably, will unnecessarily partially defeat the goal of simplifying the design already reached in the proposed embodiment). If such alternative arrangement were chosen, the fused silica block of the reference optical portion is replaced with 4 standard corner cubes (each with sharp edges) that are simply attached to the top of the plane-parallel plate birefringent component (analogous to the component 308 of the measurement portion).

It is appreciated, therefore, that the idea of the invention stems from the realization that judiciously chosen birefringent elements (including spatially-wedged birefringent elements), used in conjunction with a substantially geometrically-perfect single optically-isotropic cuboid, not only achieve the effect of imperfect retroreflection of a light beam but also—in advantageous contradistinction with designs of the related art—cause the partial sub-beams (formed at the first and second occurrence of diffraction at the diffraction grating of a workpiece-stage) overlap right at the diffraction grating itself, thereby allowing for a compact, nearly CNLE-free encoder head that accommodates large-diameter beams of light (4 mm diameter beams in the considered example). It has been demonstrated, in FIGS. 7A, 7B, 7C, that the overall size of the resulting embodiment(s) (21.2 mm wide by 14.6 mm, grating 310 to top of fused silica block 306) in substantially smaller than those of the designs of the related art, and that the measurement portion 300 of the embodiment (not accounting for the input-output unit 700) requires only 6 optical components after the polarization beam splitter (PBS). In the operation of the embodiment, as a skilled artisan will readily discern, all optical components are substantially self-aligning—as opposed to the conventional design in which individually-separate corner-cube retroreflectors are used. (There is very little alignment required in the assembly of the encoder head, as all optical components are traversed twice with a retroreflection in-between, setting the angles, at which the optical beams propagate, automatically. The angle change at the output comes almost entirely from the birefringent wedge angle(s) and the amount of birefringence ($n_o$-$n_e$). Modeling has shown that rotating the dual prism(s) used in the reference portion ad similar to those 314A, 314B, 314C, 314D of the reference portion about the y-axis in the top reference arm by +/−1° changes the output angle of each beam by about 1.8 arcseconds, so it gives the ability to tune fine adjustments to the angle of propagation of the reference (sub-)beams. Stated otherwise, the placement and alignment of the dual prisms is not operationally critical, thereby ensuring the operational stability of the embodiments of the invention.)

While the implementations of the invention and their operation are described through the above-described examples of embodiments, it will be understood by those of ordinary skill in the art that modifications to, and variations of, the illustrated embodiments may be made. For example, a further reduction of the footprint of the embodiment of the encoder head may be achieved without departing from the inventive concepts disclosed herein. One of such related embodiments (specifically, its measurement sub-portion 800) in diagrammatically illustrated in FIGS. 8A, 8B, 8C, 8D, and 8E.

The orientation of the system of coordinates in FIGS. 8A through 8E is chosen to be the same as that in FIGS. 3A through 3E. With the possible exception of geometrical sizes and/or dimensions and/or orientations in reference to the chosen coordinate system, the optical component 806 is chosen to be substantially similar or even identical (in a specific embodiment) to the optical component 306; the optical component 808 (with its fast crystal axis 812) is chosen to be substantially identical to the optical component 308 (with the axis 312). Similarly, the optical components 814A, 814B, 814C, and 814C are chosen to be substantially identical to the optical components 314A, 41B, 314C, and 314D, respectively: these components have such angle-biases of their wedges as to prevent the propagation of the CNLE beams as discussed above.

Notably, in structural comparison with the embodiment 300, the embodiment 800 includes an additional birefringent component 850 disposed in the central portion of the embodiment 850 among the birefringent wedges 814A . . . 814D below the component 808 as seen in the −z direction.

In operation, the input beam 304 is chosen to be linearly polarized along either x-axis or y-axis and is incident onto the planar surface 806A of the block 806 (which faces the PBS 712) substantially normally. Just like the component 308, the component 808 is dimensioned to not change the polarization of the input beam 304 that has traversed the block 806 and normally impinges onto the component 808 in the −z direction. At the same time, by analogy with the structure of the optical component 308 discussed above, the optically-anisotropic plate 808 is dimensioned and oriented to operate as a QWP for the $1^{st}$ order diffracted beams formed at the diffraction grating 310 (from the incident beam 304 that traversed the contraption 800) as such beams are traversing the component 808 on their way towards the single, substantially geometrically-perfect block 806. The same component 808 rotates the polarization of the retroreflected (within the block 806) $1^{st}$ order diffraction beams upon their return propagation towards the wedged elements 814A . . . 814D and the diffraction grating 310 such that these measurement sub-beams, having been diffracted by the grating for the second time (at the same location where the occurrence of the first diffraction took place) form four (4) output measurement sub-beams that are not quite parallel to one another (see discussion in reference to FIG. 6, for example).

The centrally-disposed element 850 is structured as a half-wave plate (HWP) for light 304, reaching it from the PBS 712. The crystal axis 852 of the centrally-disposed birefringent plate 850 is oriented at about 22.5 degrees with respect to the x-axis of the chosen coordinate system. Accordingly, the plate 850 rotates the linear polarization state of light 304 propagating therethrough by 45 degrees, after which the input beam 304 falls onto the grating 310 to form the $1^{st}$ order diffraction measurement sub-beams that further are directed towards the elements 814A . . . 814D (see discussion in reference to FIG. 3B, for example). The light in each of the measurement (sub-)beams is refracted in the respectively-corresponding birefringent wedge (of wedges 814A, 814B, 814C, and 814D) according to its linear polarization state, and the state of polarization is converted to that of circular polarization by the element 808. Then such light is retroreflected by the block 806 and its state of polarization is turned into the orthogonal state of polarization upon the second, return pass through the plate 808. The second pass through a corresponding wedge 814A (or 814B, or 814C, or 814D) upon the return of a measurement sub-beam towards the grating 310 is accompanied by a refraction that changes the angle of propagation of such measurement sub-beam (see discussion in reference to FIG. 3B, for example), thereby making the overall retroreflection imperfect as defined in this application. After the second occurrence of diffraction at the grating 310, all four measurement sub-beams are returned to and through the HWP 850 in the same polarization state but at slightly different angles; their polarization state is again rotated by 45 degrees upon the propagation through the HWP 850 so they return to the PBS 712 (not shown) in a polarization state that is orthogonal to the polarization state of the input beam 304.

Figure 8A:
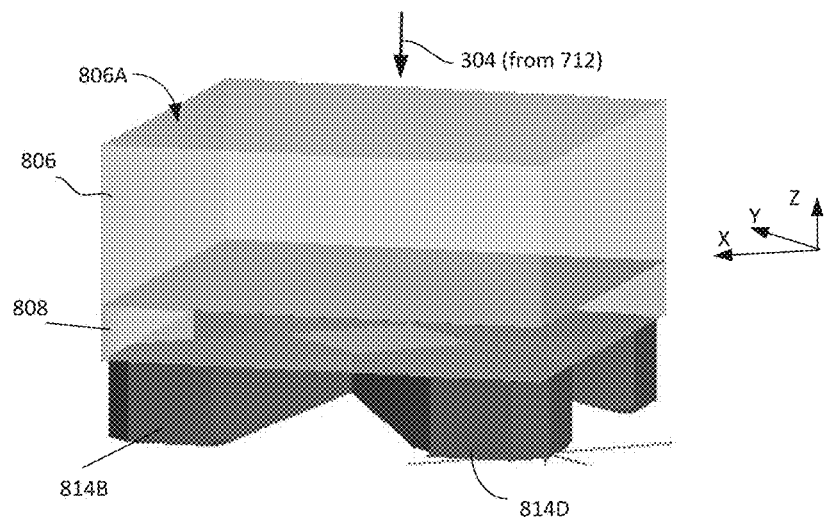
FIGS. 8A, 8B, 8C, 8D, and 8E illustrate a related embodiment of the invention.
Figure 8B:
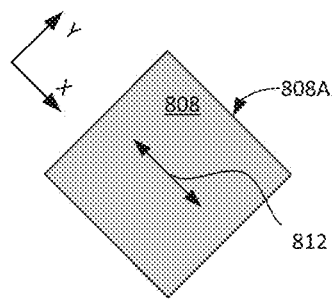
Figure 8C:
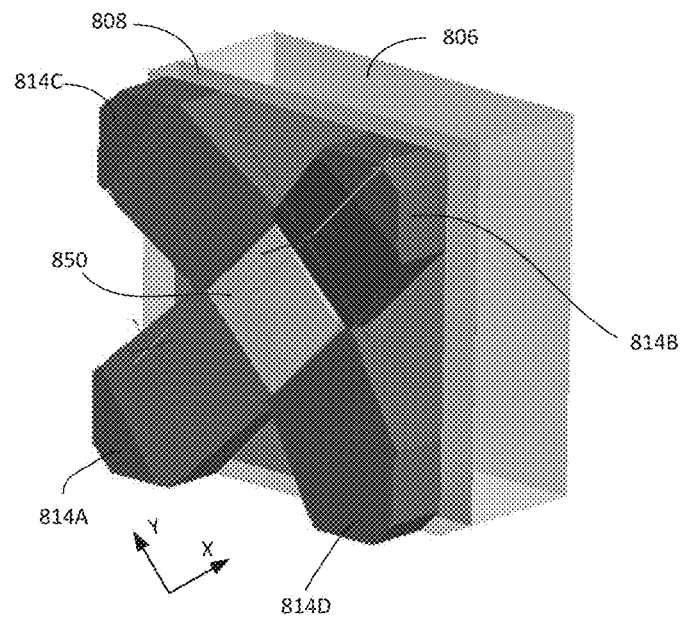
Figure 8D:
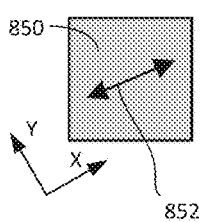
Figure 8E:
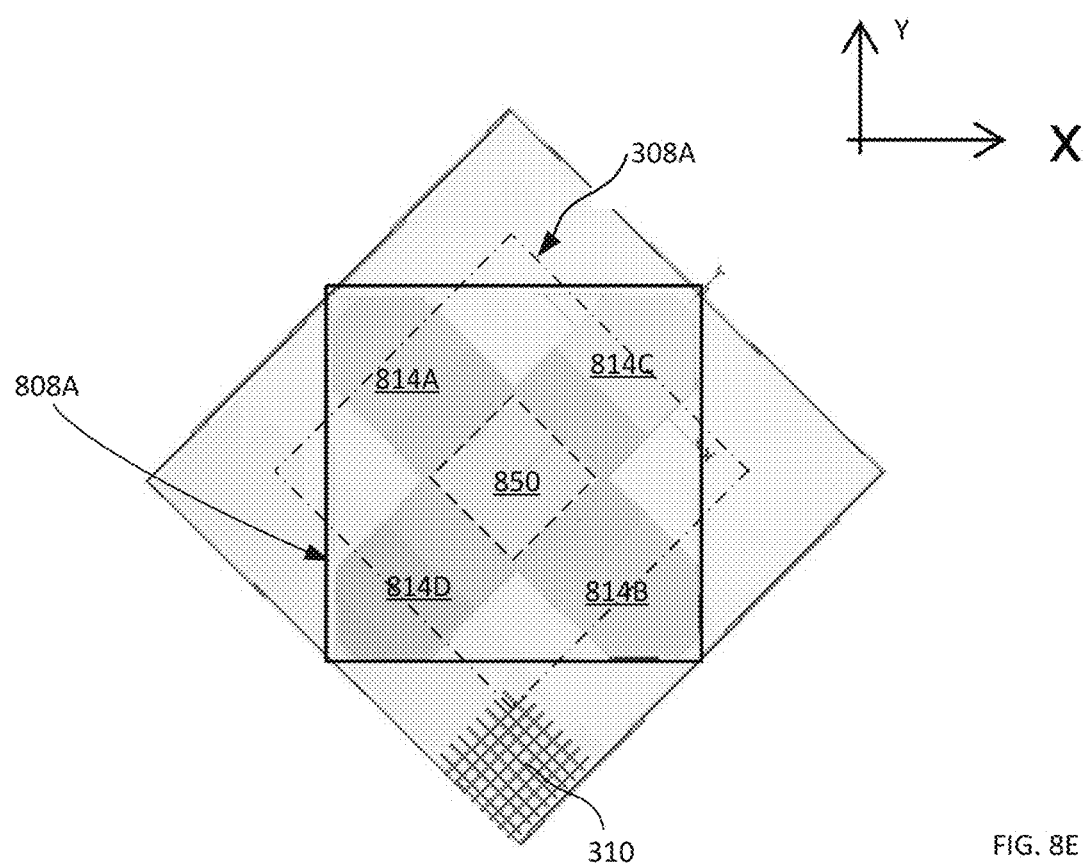

FIG. 8E illustrates the comparison between the footprint of the embodiment 300 and the footprint of the embodiment 800: the use of the additional HWP 850 facilitates the reduction of the extent of the encoder head along either x-axis or y-axis by a factor of $\sqrt{2}$, as well as some reduction in height (along the z-axis). It is noted, however, that when the exposure tool is equipped with the encoder head containing the measurement portion structures according to the embodiment 800, either the orientation of the stage grating 310 has to be changed (rotated by 45 degrees in comparison to that when the embodiment 300 is used) or encoder head itself has to be rotated by 45 degrees in the xy-plane with respect to the stage grating. The reference portion of this related embodiment may be structured substantially identically to the measurement portion 800.

It is recognized that disclosed embodiments are geared towards position monitoring of a wafer stage, but they are compact enough to be applied to any position-measuring encoder system—that is, a system in which the workpiece is not necessarily configured as a semiconductor wafer. These embodiments utilize birefringent optics in a variety of ways to maximize the input beam size while minimizing, at the same time, an overall beam footprint, the number of optical components used, and the alignment requirements to build the encoder heads. In general, disclosed is an optical system configured to retroreflect an input beam of light to form a retroreflected beam of light, which optical system includes: (i) a combination of a substantially geometrically-perfect optically-isotropic cuboid and a birefringent optical wedge, and (ii) an optical surface disposed to redirect a portion of said input beam of light, incident thereon at a chosen location, towards said combination. Here, the retroreflected beam of light is directed to interact with the optical surface at the very same location. In a specific implementation, the disclosed optical system is configured to form, from the input beam of light having a first state of polarization, the retroreflected measurement beam of light having a second state of polarization, where the first and second states of polarization are orthogonal to one another.

Overall, embodiments of the encoder head configured to implement the idea of the invention are built around a single block of optically isotropic material dimensioned to retroreflect light (from optical beams representing light diffracted at the diffraction gratings of the wafer-stage) in absence of a prismatic element such as a corner cube. Such single block is combined with at least one birefringent optical component to prevent cyclic non-linear error otherwise present in the measurement while overlapping the first- and second-pass optical beams on the diffraction grating.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

For example, a reference to an identified vector or line or plane being substantially parallel to a referenced line or plane is to be construed as such a vector or line or plane that is the same as or very close to that of the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a reference to an identified vector or line or plane being substantially perpendicular to a referenced line or plane is to be construed as such a vector or line or plane the normal to the surface of which lies at or very close to the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a term "substantially-rigid", when used in reference to a housing or structural element providing mechanical support for a contraption in question, generally identifies the structural element that rigidity of which is higher than that of the contraption that such structural element supports. As another example, the use of the term "substantially flat" in reference to the specified surface implies that such surface may possess a degree of non-flatness and/or roughness that is sized and expressed as commonly understood by a skilled artisan in the specific situation at hand. Other specific examples of the meaning of the terms "substantially", "about", and/or "approximately" as applied to different practical situations may have been provided elsewhere in this disclosure.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

In addition, it is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

The operation of embodiments of the invention has been described as including a specifically-programmed computer-readable processor controlled by instructions stored in a tangible, non-transitory storage memory. The memory may be random access memory (RAM), read-only memory (ROM), flash memory or any other memory, or combination thereof, suitable for storing control software or other instructions and data. Instruction information may be conveyed to a processor through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

Disclosed aspects, or portions of these aspects, of the invention may be combined in ways not listed above. Accordingly, the invention should not be viewed as being limited to the disclosed embodiment(s).

The invention claimed is:

1. An encoder head configured to detect a relative positional relationship of a workpiece with respect to a reference diffraction grating, the encoder head comprising:
    a first optical system configured to deliver a first beam of light with a first polarization state to a measurement position on the diffraction grating, wherein the diffraction grating is configured to form a second beam of light by diffracting the first beam of light;
    a plurality of birefringent members spatially separated from one another, wherein a birefringent member from said plurality is made from an optically-birefringent material and disposed in an optical path of the second beam of light;
    a reflector having a bottom surface and disposed
        to form a third beam of light by reflecting the second beam of light, that has passed through the birefringent member, back to the birefringent member to be transmitted through the birefringent member and to impinge at the measurement position on the diffraction grating, wherein the second beam of light has a second polarization state;
    and
    a wave plate disposed between the reflector and two birefringent members from said plurality, said wave plate being in contact with the bottom surface of the reflector at a location between said two birefringent members to intercept the third beam upon propagation of said third beam of light from the measurement position on the diffraction grating towards the reflector.

2. The encoder head according to claim 1, wherein the second polarization state is the same as the first polarization state.

3. The encoder head according to claim 2, wherein the wave plate is dimensioned to change the second polarization state to a third polarization state upon propagation of the second beam of light through the wave plate.

4. The encoder head according to claim 3, wherein the third beam of light has the third polarization state.

5. The encoder head according to claim 4, wherein the wave plate is dimensioned to change the third polarization state of the third beam of light to a fourth polarization state upon a transmission of the third beam of light through the wave plate, wherein the third polarization state and the fourth polarization state differ from one another.

6. The encoder head according to claim 1, wherein the wave plate is dimensioned to change a polarization state of a beam of light incident thereon obliquely.

7. The encoder head according to claim 6, wherein the wave plate is dimensioned to not change a polarization state of a beam of light incident thereon normally.

8. The encoder head of claim 1, wherein the reflector includes a retro-reflection member configured to form the third beam of light by retro-reflecting the second beam of light.

9. A stage assembly configured to move the workpiece and including
a stage retaining the workpiece, and the encoder head according to claim 1 configured to measure said relative positional relationship.

10. An exposure apparatus including
an illumination system; and
the stage assembly according to claim 9 that, in operation, moves the stage relative to the illumination system.

11. A process for manufacturing a device, the process including
providing a substrate; and
forming an optical image on the substrate with the exposure apparatus according to claim 10.

* * * * *